US008959463B2

(12) United States Patent
Fujimura et al.

(10) Patent No.: US 8,959,463 B2
(45) Date of Patent: Feb. 17, 2015

(54) METHOD AND SYSTEM FOR DIMENSIONAL UNIFORMITY USING CHARGED PARTICLE BEAM LITHOGRAPHY

(71) Applicant: D2S, Inc., San Jose, CA (US)

(72) Inventors: Akira Fujimura, Saratoga, CA (US); Kazuyuki Hagiwara, Tokyo (JP); Robert C. Pack, Morgan Hill, CA (US); Anatoly Aadamov, Palo Alto, CA (US)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 13/801,554

(22) Filed: Mar. 13, 2013

(65) Prior Publication Data

US 2014/0129996 A1 May 8, 2014

Related U.S. Application Data

(60) Provisional application No. 61/724,232, filed on Nov. 8, 2012.

(51) Int. Cl.
*G06F 17/50* (2006.01)
(52) U.S. Cl.
CPC ........ *G06F 17/5081* (2013.01); *G06F 17/5009* (2013.01)
USPC .................... 716/54; 716/51; 716/52; 716/53
(58) Field of Classification Search
USPC .................................................. 716/51–54
See application file for complete search history.

(56) References Cited

U.S. PATENT DOCUMENTS

| 5,173,582 | A |   | 12/1992 | Sakamoto et al. |
| 5,334,282 | A |   | 8/1994 | Nakayama et al. |
| 5,863,682 | A | * | 1/1999 | Abe et al. .................. 430/30 |

(Continued)

FOREIGN PATENT DOCUMENTS

| EP | 1429368 A2 | 6/2004 |
| GB | 2367908 | 4/2002 |

(Continued)

OTHER PUBLICATIONS

Gek Soon Chua et al., "Optimization of Mask Shot Count Using MB-MDP and Lithography Simulation", Photomask Technology 2011, Oct. 13, 2011, pp. 816632-1-816632-11, vol. 8166, SPIE, Bellingham, Washington, U.S.A.

(Continued)

*Primary Examiner* — Naum B Levin
(74) *Attorney, Agent, or Firm* — The Mueller Law Office, P.C.

(57) ABSTRACT

A method for mask process correction or forming a pattern on a resist-coated reticle using charged particle beam lithography is disclosed, where the reticle is to be used in an optical lithographic process to form a pattern on a wafer, where the sensitivity of the wafer pattern is calculated with respect to changes in resist exposure of the reticle, and where the pattern exposure information is modified to lower the calculated sensitivity. A method for fracturing or mask data preparation is also disclosed, where pattern exposure information is determined that can form a pattern on a resist-coated reticle using charged particle beam lithography, where the reticle is to be used in an optical lithographic process to form a pattern on a wafer, and where the sensitivity of the wafer pattern is calculated with respect to changes in resist exposure of the reticle.

26 Claims, 8 Drawing Sheets

(56) References Cited

U.S. PATENT DOCUMENTS

| | | | |
|---|---|---|---|
| 6,218,671 B1 | 4/2001 | Gordon et al. | |
| 6,372,391 B1 | 4/2002 | Wolfe et al. | |
| 6,495,841 B1* | 12/2002 | Ando et al. | 250/492.23 |
| 6,557,162 B1 | 4/2003 | Pierrat | |
| 6,891,175 B2 | 5/2005 | Hiura | |
| 7,386,830 B2* | 6/2008 | Fukuhara | 716/53 |
| 7,435,517 B2* | 10/2008 | Hudek et al. | 430/30 |
| 7,747,977 B1* | 6/2010 | Lapanik et al. | 716/50 |
| 7,754,401 B2* | 7/2010 | Fujimura et al. | 430/30 |
| 7,799,489 B2* | 9/2010 | Fujimura et al. | 430/5 |
| 7,816,061 B2* | 10/2010 | Schenker et al. | 430/5 |
| 7,981,575 B2 | 7/2011 | Fujimura et al. | |
| 8,062,813 B2 | 11/2011 | Zable et al. | |
| 8,207,514 B2* | 6/2012 | Hara et al. | 250/492.22 |
| 8,221,939 B2 | 7/2012 | Zable et al. | |
| 8,458,624 B2* | 6/2013 | Choi et al. | 716/52 |
| 8,473,875 B2* | 6/2013 | Fujimura et al. | 716/53 |
| 2003/0043358 A1 | 3/2003 | Suganuma et al. | |
| 2003/0087191 A1 | 5/2003 | Lavallee et al. | |
| 2003/0159125 A1 | 8/2003 | Wang et al. | |
| 2004/0011966 A1 | 1/2004 | Sasaki et al. | |
| 2005/0221204 A1 | 10/2005 | Kimura | |
| 2007/0114463 A1 | 5/2007 | Nakasugi et al. | |
| 2008/0054196 A1 | 3/2008 | Hiroshima | |
| 2008/0067423 A1* | 3/2008 | Kimura et al. | 250/492.1 |
| 2010/0183963 A1* | 7/2010 | Zable et al. | 430/30 |
| 2010/0325595 A1 | 12/2010 | Song et al. | |
| 2011/0068281 A1* | 3/2011 | Hara et al. | 250/492.22 |
| 2011/0145769 A1 | 6/2011 | Wei | |
| 2012/0094219 A1* | 4/2012 | Fujimura et al. | 430/5 |
| 2012/0126116 A1* | 5/2012 | Tanaka et al. | 250/307 |
| 2012/0149133 A1 | 6/2012 | Parrish et al. | |
| 2013/0022929 A1* | 1/2013 | Komagata et al. | 430/322 |
| 2013/0070222 A1 | 3/2013 | Fujimura | |
| 2013/0283218 A1 | 10/2013 | Fujimura et al. | |

FOREIGN PATENT DOCUMENTS

| | | |
|---|---|---|
| JP | 4196516 A | 7/1992 |
| JP | 2000091191 A | 3/2000 |
| JP | 2000123768 A | 4/2000 |
| JP | 2002202590 A | 7/2002 |
| JP | 2002217092 A | 8/2002 |
| JP | 2008066441 A | 3/2008 |
| TW | 495834 B | 7/2002 |
| TW | I222100 B | 10/2004 |
| TW | 200604763 A | 2/2006 |
| WO | 03036386 A | 5/2003 |

OTHER PUBLICATIONS

Office Action dated Feb. 14, 2014 for U.S. Appl. No. 13/801,571.
Notice of Allowance and Fees dated Aug. 1, 2014 for U.S. Appl. No. 14/108,135.
Notice of Allowance and Fees dated Aug. 15, 2014 for U.S. Appl. No. 13/959,530.
Notice of Allowance and Fees dated Jul. 23, 2014 for U.S. Appl. No. 13/970,465.
Office Action dated Aug. 5, 2014 for Japanese Patent Application No. 2012-525091.
Office Action dated Jul. 15, 2014 for U.S. Appl. No. 13/037,270.
Office Action dated Jul. 8, 2014 for Japanese Patent Application No. 2009-200191.
Official Letter and Search Report dated Aug. 21, 2014 for Taiwanese Patent Application No. 098128359.
Official letter and search report dated Aug. 6, 2014 for Taiwanese Patent Application No. 099127553.
Office Action dated Oct. 15, 2014 for U.S. Appl. No. 13/862,476.
Office Action dated Oct. 20, 2014 for U.S. Appl. No. 13/862,471.
Office Action dated Oct. 24, 2014 for U.S. Appl. No. 14/106,584.
Office Action dated Oct. 6, 2014 for U.S. Appl. No. 14/331,008.

* cited by examiner

METHOD AND SYSTEM FOR DIMENSIONAL UNIFORMITY USING CHARGED PARTICLE BEAM LITHOGRAPHY

RELATED APPLICATIONS

This application claims priority to U.S. Provisional Patent Application Ser. No. 61/724,232 filed on Nov. 8, 2012 and entitled "Method and System For Improving Critical Dimension Uniformity Using Shaped Beam Lithography"; and is related to Fujimura, U.S. patent application Ser. No. 13/801,571 filed on Mar. 13, 2013 and entitled "Method and System For Dimensional Uniformity Using Charged Particle Beam Lithography"; both of which are hereby incorporated by reference for all purposes.

BACKGROUND OF THE DISCLOSURE

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays, holographic masks or even other reticles. While conventional optical lithography uses a light source having a wavelength of 193 nm, extreme ultraviolet (EUV) or X-ray lithography are also considered types of optical lithography in this application. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, directed self-assembly (DSA) guard bands, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection. Shaped beam charged particle beam lithography may use either a single shaped beam, or may use a plurality of shaped beams simultaneously exposing the surface, the plurality of shaped beams producing a higher writing speed than a single shaped beam.

As indicated, in lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

Inverse lithography technology (ILT) is one type of OPC technique. ILT is a process in which a pattern to be formed on a reticle is directly computed from a pattern which is desired to be formed on a substrate such as a silicon wafer. This may include simulating the optical lithography process in the reverse direction, using the desired pattern on the substrate as input. ILT-computed reticle patterns may be purely curvilinear—i.e. completely non-rectilinear—and may include circular, nearly circular, annular, nearly annular, oval and/or nearly oval patterns. Since these ideal ILT curvilinear patterns are difficult and expensive to form on a reticle using conventional techniques, rectilinear approximations or rectilinearizations of the ideal curvilinear patterns may be used. The rectilinear approximations decrease accuracy, however, compared to the ideal ILT curvilinear patterns. Additionally, if the rectilinear approximations are produced from the ideal ILT curvilinear patterns, the overall calculation time is increased compared to ideal ILT curvilinear patterns. In this disclosure ILT, OPC, source mask optimization (SMO), and computational lithography are terms that are used interchangeably.

There are a number of technologies used for forming patterns on a reticle, including using optical lithography or charged particle beam lithography. The most commonly used system is the variable shaped beam (VSB), where, as described above, doses of electrons with simple shapes such as manhattan rectangles and 45-degree right triangles expose a resist-coated reticle surface. In conventional mask writing, the doses or shots of electrons are designed to avoid overlap wherever possible, so as to greatly simplify calculation of how the resist on the reticle will register the pattern. Similarly, the set of shots is designed so as to completely cover the pattern area that is to be formed on the reticle. U.S. Pat. No. 7,754,401, owned by the assignee of the present patent application and incorporated by reference for all purposes, discloses a method of mask writing in which intentional shot overlap for writing patterns is used. When overlapping shots are used, charged particle beam simulation can be used to determine the pattern that the resist on the reticle will register. Use of overlapping shots may allow patterns to be written with reduced shot count. U.S. Pat. No. 7,754,401 also discloses use of dose modulation, where the assigned dosages of shots vary with respect to the dosages of other shots. The term model-based fracturing is used to describe the process of determining shots using the techniques of U.S. Pat. No. 7,754,401.

SUMMARY OF THE DISCLOSURE

A method for mask process correction or forming a pattern on a resist-coated reticle using charged particle beam lithography is disclosed, where the reticle is to be used in an optical lithographic process to form a pattern on a wafer, where the sensitivity of the wafer pattern is calculated with respect to changes in resist exposure of the reticle and where the pattern exposure information is modified to lower the calculated sensitivity.

A method for fracturing or mask data preparation is also disclosed, where pattern exposure information is determined that can form a pattern on a resist-coated reticle using charged particle beam lithography, where the reticle is to be used in an optical lithographic process to form a pattern on a wafer, and where the sensitivity of the wafer pattern is calculated with respect to changes in resist exposure of the reticle.

DETAILED DESCRIPTION OF THE EMBODIMENTS

The present disclosure is related to lithography, and more particularly to the design and manufacture of a surface which may be a reticle, a wafer, or any other surface, using charged particle beam lithography.

Figure 1:
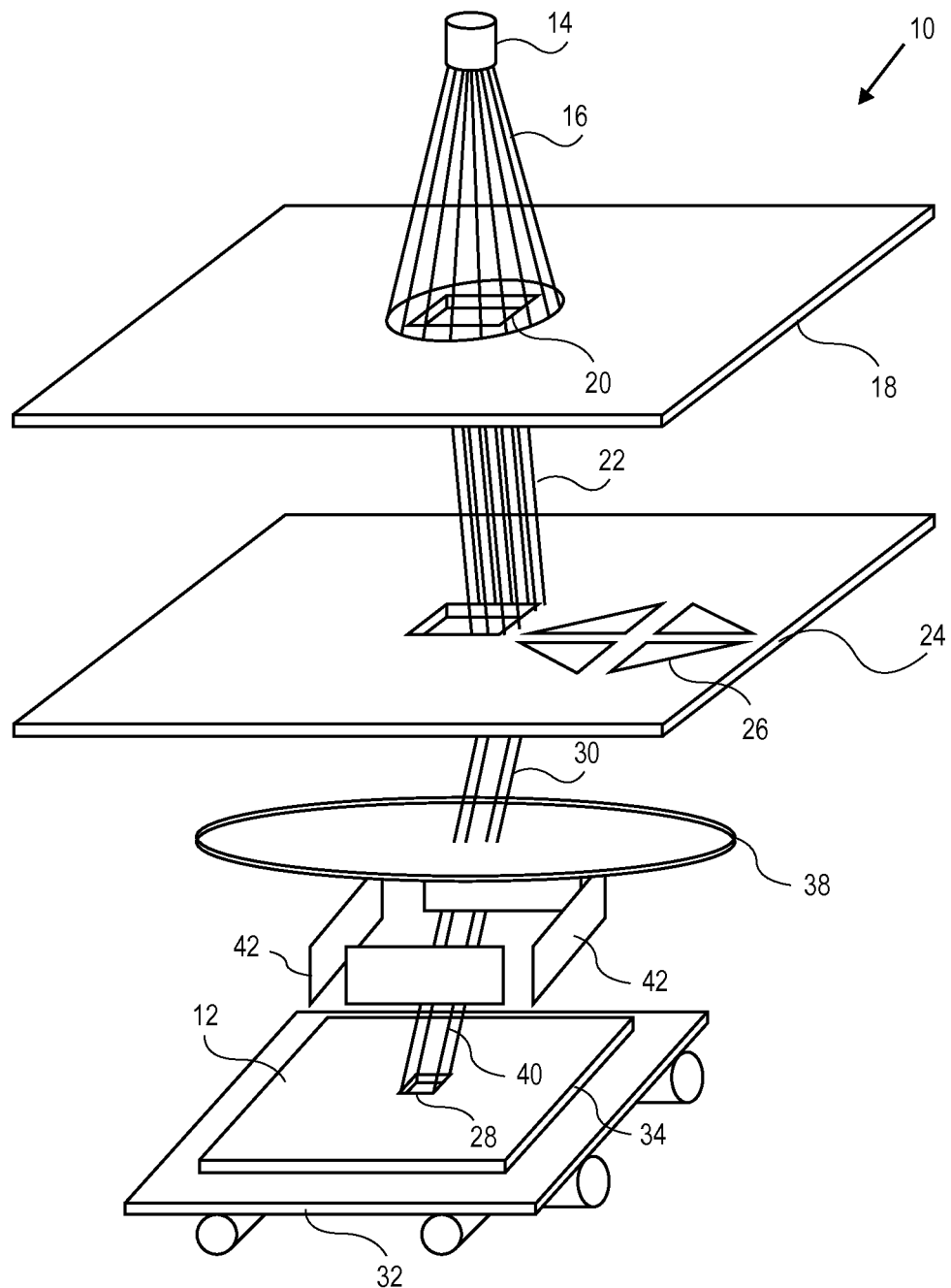
FIG. 1 illustrates an example of a variable shaped beam (VSB) charged particle beam system.

Referring now to the drawings, wherein like numbers refer to like items, FIG. 1 illustrates an embodiment of a lithography system, such as a charged particle beam writer system, in this case an electron beam writer system 10, that employs a variable shaped beam (VSB) to manufacture a surface 12. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil 24 has formed therein a number of openings or apertures 26 that define various simple shapes such as rectangles and triangles. Each aperture 26 formed in the stencil 24 may be used to form a pattern in the surface 12 of a substrate 34, such as a silicon wafer, a reticle or other substrate. An electron beam 30 emerges from one of the apertures 26 and passes through an electromagnetic or electrostatic reduction lens 38, which reduces the size of the pattern emerging from the aperture 26. In commonly available charged particle beam writer systems, the reduction factor is between 10 and 60. The reduced electron beam 40 emerges from the reduction lens 38 and is directed by a series of deflectors 42 onto the surface 12 as a pattern 28. The surface 12 is coated with resist (not shown) which reacts with the electron beam 40. The electron beam 22 may be directed to overlap a variable portion of an aperture 26, affecting the size and shape of the pattern 28. Blanking plates (not shown) are used to deflect the beam 16 or the shaped beam 22 so as to prevent the electron beam from reaching the surface 12 during a period after each shot when the lenses directing the beam 22 and the deflectors 42 are being re-adjusted for the succeeding shot. Typically the blanking plates are positioned so as to deflect the electron beam 16 to prevent it from illuminating aperture 20. The blanking period may be a fixed length of time, or it may vary depending, for example, on how much the deflector 42 must be re-adjusted for the position of the succeeding shot.

In electron beam writer system 10, the substrate 34 is mounted on a movable platform 32. The platform 32 allows substrate 34 to be repositioned so that patterns which are larger than the maximum deflection capability or field size of the charged particle beam 40 may be written to surface 12 in a series of subfields, where each subfield is within the capability of deflector 42 to deflect the beam 40. In one embodiment the substrate 34 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 28, generally reduced in size, onto a silicon wafer to produce an integrated circuit. More generally, the mask is used in another device or machine to transfer the pattern 28 on to a substrate (not illustrated).

Other types of charged particle beam writers include character projection and multi-beam. In a multi-beam writer the pattern is created by a plurality of charged particle beams which deposit dosage on a resist-coated surface. The surface may remain stationary or may continuously slowly move. Many thousands of beams may be used so as to achieve a high writing speed.

The minimum size pattern that can be projected with reasonable accuracy onto a surface 12 is limited by a variety of short-range physical effects associated with the electron beam writer system 10 and with the surface 12, which normally comprises a resist coating on the substrate 34. These effects include forward scattering, Coulomb effect, and resist diffusion. Beam blur, also called $\beta_f$, is a term used to include all of these short-range effects. The most modern electron beam writer systems can achieve an effective beam blur radius or $\beta_f$ in the range of 20 nm to 30 nm. Forward scattering may constitute one quarter to one half of the total beam blur. Modern electron beam writer systems contain numerous mechanisms to reduce each of the constituent pieces of beam blur to a minimum. Since some components of beam blur are a function of the calibration level of a particle beam writer, the $\beta_f$ of two particle beam writers of the same design may differ. The diffusion characteristics of resists may also vary. Variation of $\beta_f$ based on shot size or shot dose can be simulated and systemically accounted for. But there are other effects that cannot or are not accounted for, and they appear as random variation.

The shot dosage of a shaped beam charged particle beam writer such as an electron beam writer system is a function of the intensity of the beam source 14 and the exposure time for each shot. Typically the beam intensity remains nominally fixed, and the exposure time is varied to obtain variable shot dosages. The exposure time may be varied to compensate for various long-range effects such as backscatter, fogging, and loading effects in a process called proximity effect correction (PEC). Electron beam writer systems usually allow setting an overall dosage, called a base dosage, which affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots implicitly have the base dosage, before PEC. Other electron beam writer systems do allow explicit dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels.

Conventionally, shots are designed so as to completely cover an input pattern with rectangular shots, while avoiding shot overlap wherever possible within an exposure pass. Also, all shots are designed to have a normal dosage, which is a dosage at which a relatively large rectangular shot, in the absence of long-range effects, will produce a pattern on the surface which is the same size as is the shot size. Some electron beam writer systems enforce this methodology by not allowing shots to overlap within an exposure pass.

In exposing, for example, a repeated pattern on a surface using charged particle beam lithography, the size of each pattern instance, as measured on the final manufactured surface, will be slightly different, due to manufacturing variations. The amount of the size variation is an essential manufacturing optimization criterion. In current mask masking, a root mean square (RMS) variation of no more than 1 nm (1 sigma) in pattern size may be desired. More size variation translates to more variation in circuit performance, leading to higher design margins being required, making it increasingly difficult to design faster, lower-power integrated circuits. This variation is referred to as critical dimension (CD) variation. A low CD variation is desirable, and indicates that manufacturing variations will produce relatively small size variations on the final manufactured surface. In the smaller scale, the effects of a high CD variation may be observed as line edge roughness (LER). LER is caused by each part of a line edge being slightly differently manufactured, leading to some waviness in a line that is intended to have a straight edge. CD variation is, among other things, inversely related to the slope of the dosage curve at the resist threshold, which is called edge slope. Therefore, edge slope, or dose margin, is a critical optimization factor for particle beam writing of surfaces. In this disclosure, edge slope and dose margin are terms that are used interchangeably.

As described above, process variations can cause the width of a pattern on a photomask to vary from the intended or target width. The pattern width variation on the photomask will cause a pattern width variation on a wafer which has been exposed with the photomask using an optical lithographic process. The sensitivity of the wafer pattern width to variations in photomask pattern width is called mask edge error factor, or MEEF. In an optical lithography system using a 4× photomask, where the optical lithographic process projects a 4× reduced version of the photomask pattern onto the wafer, a MEEF of 1, for example means that for each 1 nm error in pattern width on a photomask, the pattern width on the wafer will change by 0.25 nm. A MEEF of 2 means that for a 1 nm error in photomask pattern width, the pattern width on the wafer will change by 0.5 nm. For the smallest integrated circuits processes, MEEF may be greater than 2. This relationship can be expressed in equation form as $$\Delta CDwafer = \frac{MEEF}{R} \Delta CDmask \quad (1)$$

where R is the reduction factor, typically 4 for integrated circuit fabrication. The usefulness of MEEF has rested on two assumptions:

That different mask shapes have similar sensitivity to errors

Mask error can be approximated by a uniform bias

Figure 2:
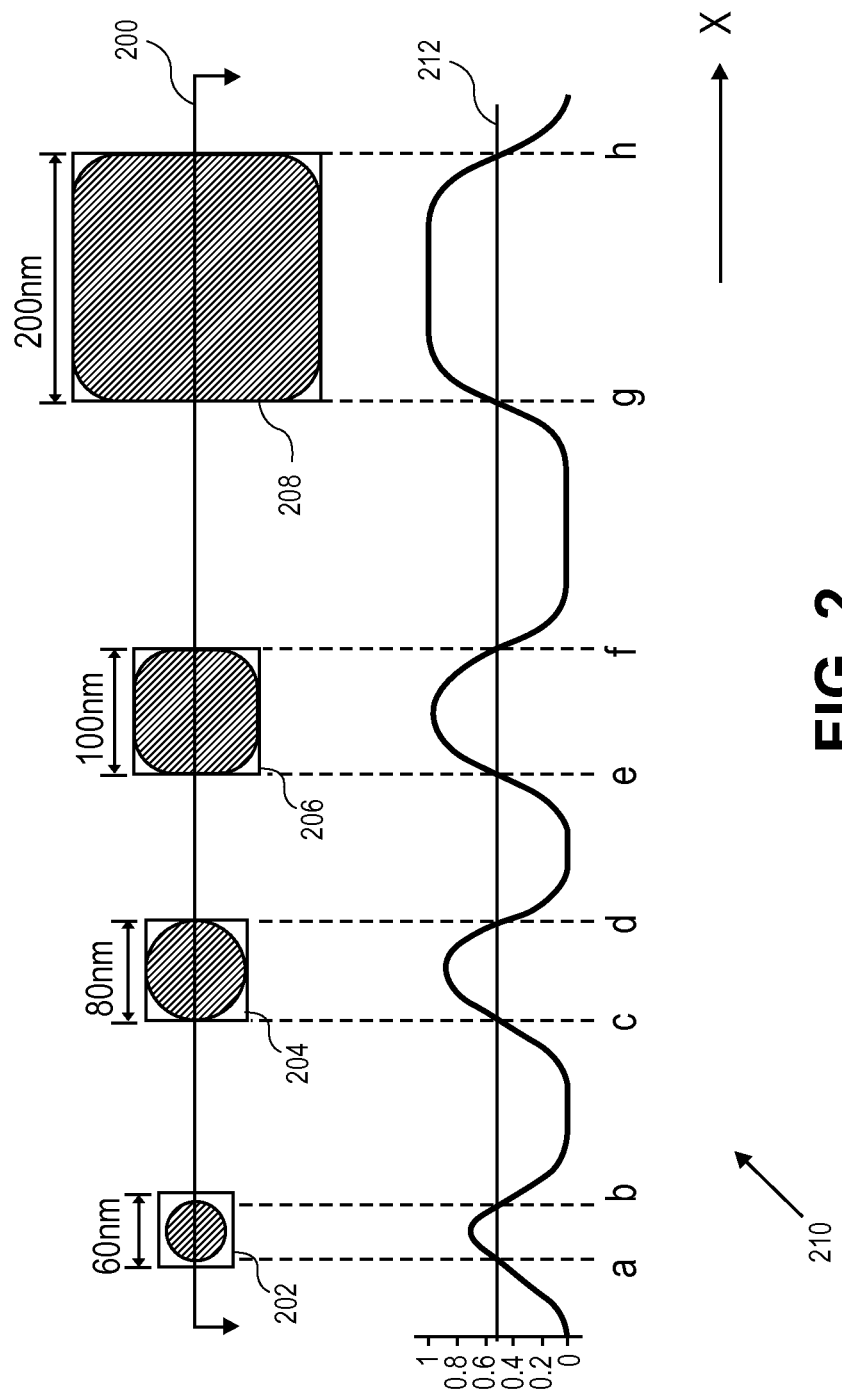
FIG. 2 illustrates examples of patterns formed using various sized VSB shots, and the cross sectional dosage for each pattern.

FIG. 2 illustrates examples of four example mask patterns formed by square VSB shots of different sizes, and a graph of the longitudinal dosage profile through the centerline of each pattern. Pattern 208 is a square 200 nm shot, pattern 206 is a square 100 nm shot, pattern 204 is a square 80 nm shot, and pattern 202 is a square 60 nm shot. Beam blur causes the corners of all shots to be rounded, sufficiently so that patterns formed with the smaller shots register on the resist as circles. The dosage profile graph 210 illustrates the longitudinal dosage profile through line 200. The vertical axis of dosage profile graph 210 is the fraction of normal dosage. Dosage profile graph 210 illustrates a resist threshold 212 of 0.5 of normal dosage. The calculated edge slope of pattern 208 at x-coordinates "g" and "h" is 1.89% of normal dosage per nm. The calculated edge slope of pattern 206 at x-coordinates "e" and "f" is 1.85% of normal dosage per nm. The calculated edge slope of pattern 204 at x-coordinates "c" and "d" is 1.75% of normal dosage per nm. The calculated edge slope of pattern 202 at x-coordinates "a" and "b" is 1.49% of normal dosage per nm. The smaller edge slope for the smaller patterns 202 and 204 will cause a larger CD change in these patterns for a given change in dosage, compared to the larger patterns 206 and 208.

Therefore, the above equation (1) is no longer helpful in predicting the sensitivity of the wafer pattern to a change in dosage for patterns smaller than about 100 nm. In equation form, the relationship between a change in dosage and the resulting mask CD change can be expressed as $$\Delta CDmask = DoseEdgeSlope \cdot \Delta Dose \quad (2)$$

Figure 3:
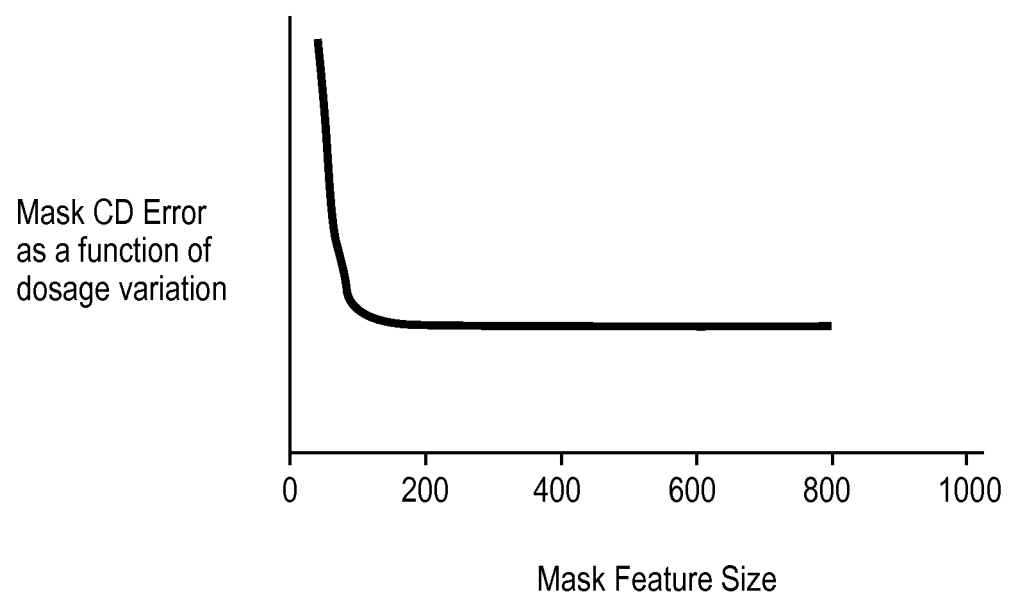
FIG. 3 illustrates a graph of mask critical dimension (CD) error as a function of dosage variation, for mask features of different sizes.

Using equation (2) with charged particle beam simulation, with the only simulated effect being a forward scattering radius of 30 nm, the relationship between mask feature size and mask $\Delta CD$ can be derived. This is illustrated in FIG. 3. As can be seen, as the feature size of a mask pattern falls below 100 nm, the mask $\Delta CD$ goes up rapidly for a given dosage variation.

More generally, $\Delta Dose$ may be caused either by a change in actual charged particle dosage received by the resist, or by a change in the dosage threshold at which the resist will register a pattern. In this disclosure, the terms "dosage change" and "resist exposure" both refer to both of these phenomena. An increase in resist exposure may be produced either by an increase in actual charged particle dosage or by a lowering of the resist threshold. Similarly, a decrease in resist exposure may be produced either by a decrease in actual charged particle dosage or by an increase in the resist threshold.

Given that the conventional MEEF method will not accurately predict wafer CD sensitivity for a change in dose for shapes <100 nm, there is a need for alternate methods to determine wafer CD sensitivity to changes in resist exposure. In the current disclosure, the wafer CD sensitivity to resist exposure change is calculated in what can be viewed as a two-step process:

1. calculate the sensitivity of the mask CD to a change in resist exposure
2. calculate the sensitivity of the wafer CD to a change in mask CD Step 1 may be accomplished using, for example, charged particle beam simulation to calculate a mask pattern for each of two dosages: a minimum resist exposure and a maximum resist exposure. Step 2 may be accomplished using, for example, lithography simulation, starting from the two mask patterns calculated in step 1. Alternatively, reticle patterns may be physically exposed at a lower-limit resist exposure and an upper-limit resist exposure, and the resulting mask used to print patterns on a substrate using optical lithography, after which the CDs of the substrate patterns can be measured. The details of the two steps will be described below.

The calculation of step 1, called charged particle beam simulation above, and more commonly called E-beam simulation, may be more accurately described as a mask process simulation step. Charged particle beam simulation must take into account effects associated with the charged particle beam exposure process itself, such as forward scattering, backward scattering, resist diffusion, resist charging, Coulomb effect and fogging, as well as non-exposure effects such as develop, bake and etch efforts, including, for example, loading. Similarly, step 2 may be described as a wafer process simulation step, although it is more commonly called lithography simulation or litho simulation.

Figure 4:
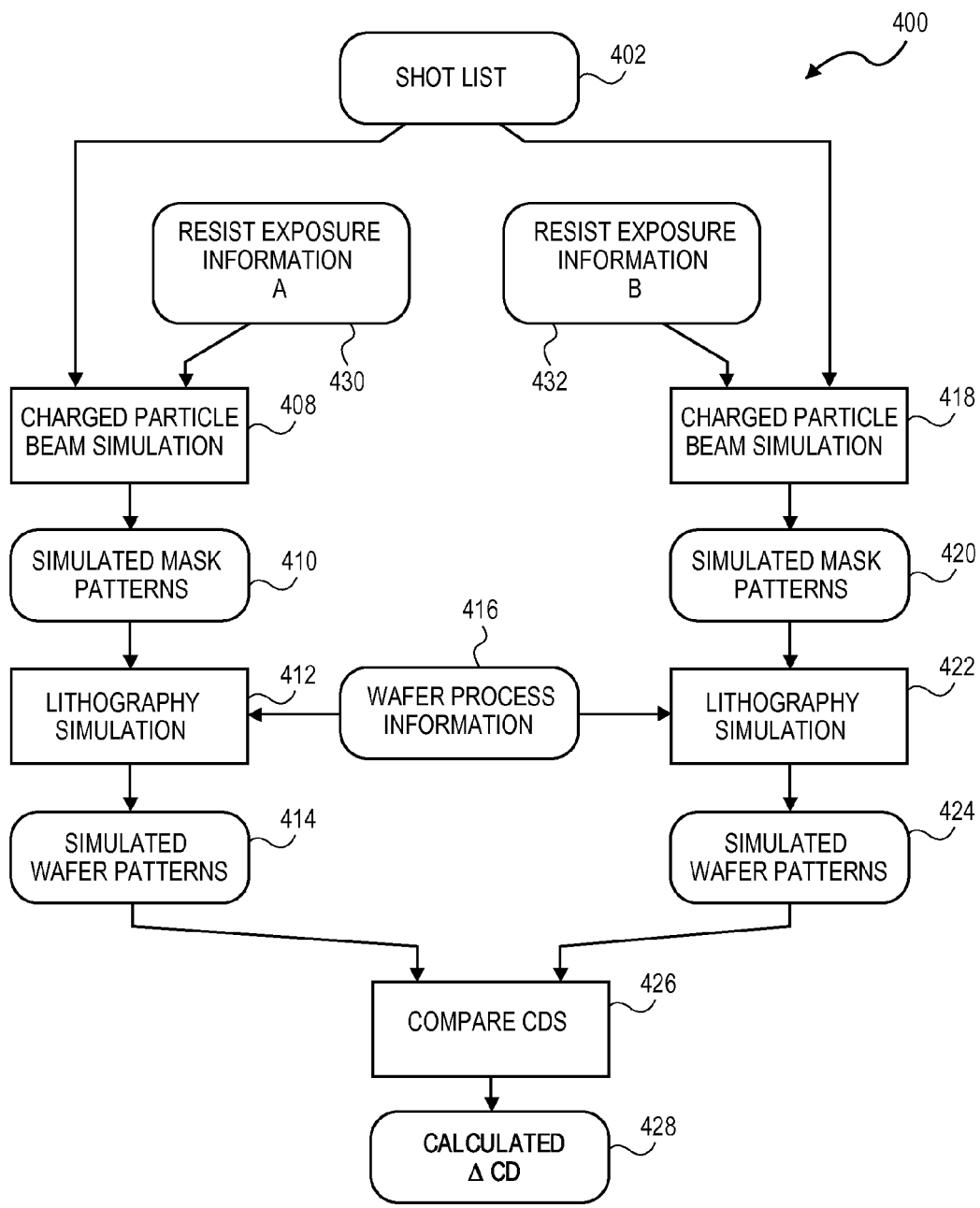
FIG. 4 illustrates an exemplary conceptual flow diagram for calculating the sensitivity of a wafer CD with respect the dosage variation of charged particle beam shots used to write the mask pattern used to form the wafer pattern.

The conceptual flow diagram of FIG. 4 illustrates an exemplary method 400 for calculating wafer CD sensitivity to variation in resist exposure, when using a shaped beam charged particle beam writer. The primary input to the process is a shot list 402. Additional inputs are resist exposure information "A" 430, resist exposure information "B" 432, and wafer process information 416. Resist exposure information 430 and 432 may comprise resist threshold information. In some embodiments, resist exposure information 430 and 432 may also comprise charged particle beam dosage information. In other embodiments, shot list 402 may contain the charged particle beam dosage information. In yet other embodiments, shot list 402 may contain charged particle beam dosage information, which is combined with base dosage information in resist exposure information 430 and 432 to determine an actual charged particle beam dosage. In step 408 the shot list 402 is simulated using the resist exposure information "A" 430. Charged particle beam simulation is used for the simulation. Simulation step 408 creates simulated mask patterns 410. In step 412 lithography simulation is performed on simulated mask patterns 410 using wafer process information 416 to create simulated wafer patterns 414. Similar steps are performed for the resist exposure information "B" 432. Charged particle beam simulation 418 is performed on shot list 402 using resist exposure information "B" 432. The charged particle beam simulation 418 creates simulated mask patterns 420. In step 422 lithography simulation is performed on simulated mask patterns 420, using wafer process information 416, to create simulated wafer patterns 424. Finally, in step 426 simulated wafer patterns 414 are compared with simulated wafer patterns 424 to calculate the ΔCD 428 of the wafer patterns. The ΔCD 428 is the change in wafer CD with the change in dosage from resist exposure information "A" 430 to resist exposure information "B" 432. CD comparison step 426 may compare the wafer pattern CDs at many places in the wafer patterns. In some embodiments the ΔCD 428 may be divided by the difference between resist exposure information 430 and resist exposure information 432, obtaining ΔCD per unit change in resist exposure.

In other embodiments when using a multi-beam charged particle beam writer, the input to method 400 will be pattern exposure information for the multi-beam charged particle beam writer.

In those areas of the simulated wafer pattern where wafer sensitivity with respect to mask writing dosage is found to be too high, a method is needed to reduce the wafer sensitivity in these problem areas. Since, in general, the larger-than-desired wafer pattern ΔCD is the result of a relatively large mask pattern ΔCD, the mask pattern sensitivity to a change in resist exposure must be lowered. Equation (2) above indicates that this can be accomplished by increasing the edge slope at the perimeter of a pattern or patterns in a problem area. One method of increasing edge slope is to increase the dosage of the entire exposed pattern, such as by increasing the dosage of all shots if using shaped beam charged particle beam lithography. This method has the disadvantages of increasing write time, and also increasing backscattering, thereby lowering the edge slope of all patterns. It is therefore best to add dosage only where necessary, such as around the perimeter of the problem shapes. However, FIG. 2 illustrates that using small or narrow shots around the perimeter of a shape will tend to increase the sensitivity of the shape's CD to a change in resist exposure. An alternative is therefore to generate overlapping shots to increase the dosage near the perimeter of the shape.

Figure 7A:
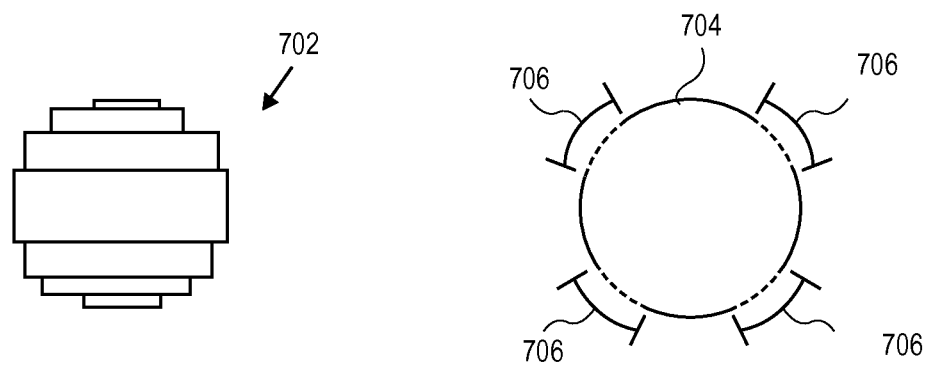
FIG. 7A illustrates an example of a set of conventional shots that may be used to form a circular pattern such as a sub-100 nm pattern.
Figure 7B:
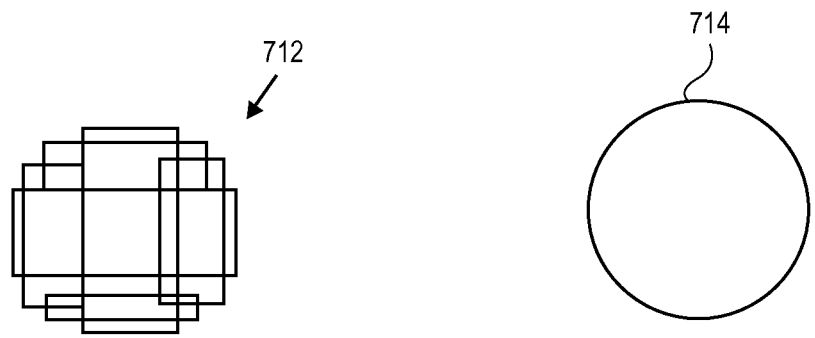
FIG. 7B illustrates an example of a set of overlapping shots that may be used to form a circular pattern according to an embodiment of the current disclosure.

FIGS. 7A&B illustrate examples of two configurations of VSB shots that may be used to form a circular pattern, such as may be generated by ILT OPC. FIG. 7A illustrates an example of a set of conventional non-overlapping shots 702. Set of shots 702 consists of 7 shots. Pattern 704 illustrates a pattern that set of shots 702 may form on a reticle or mask. In this example pattern 704 is less than 100 nm in diameter. Charged particle beam simulation shows that pattern 704 has areas of low edge slope 706 along portions of its perimeter. In these areas the perimeter of pattern 704 is too sensitive to changes in resist exposure. FIG. 7B illustrates an example of another set of shots 712 determined according to an embodiment of the current disclosure. Set of shots 712 consists of 6 overlapping shots. By allowing shot overlap within an exposure pass, set of shots 712 does not use numerous narrow shots as does set of shots 702. By avoiding the narrow shots which are more sensitive to resist exposure changes, set of shots 712 forms circular pattern 714 which does not have areas of low edge slope.

Figure 5:
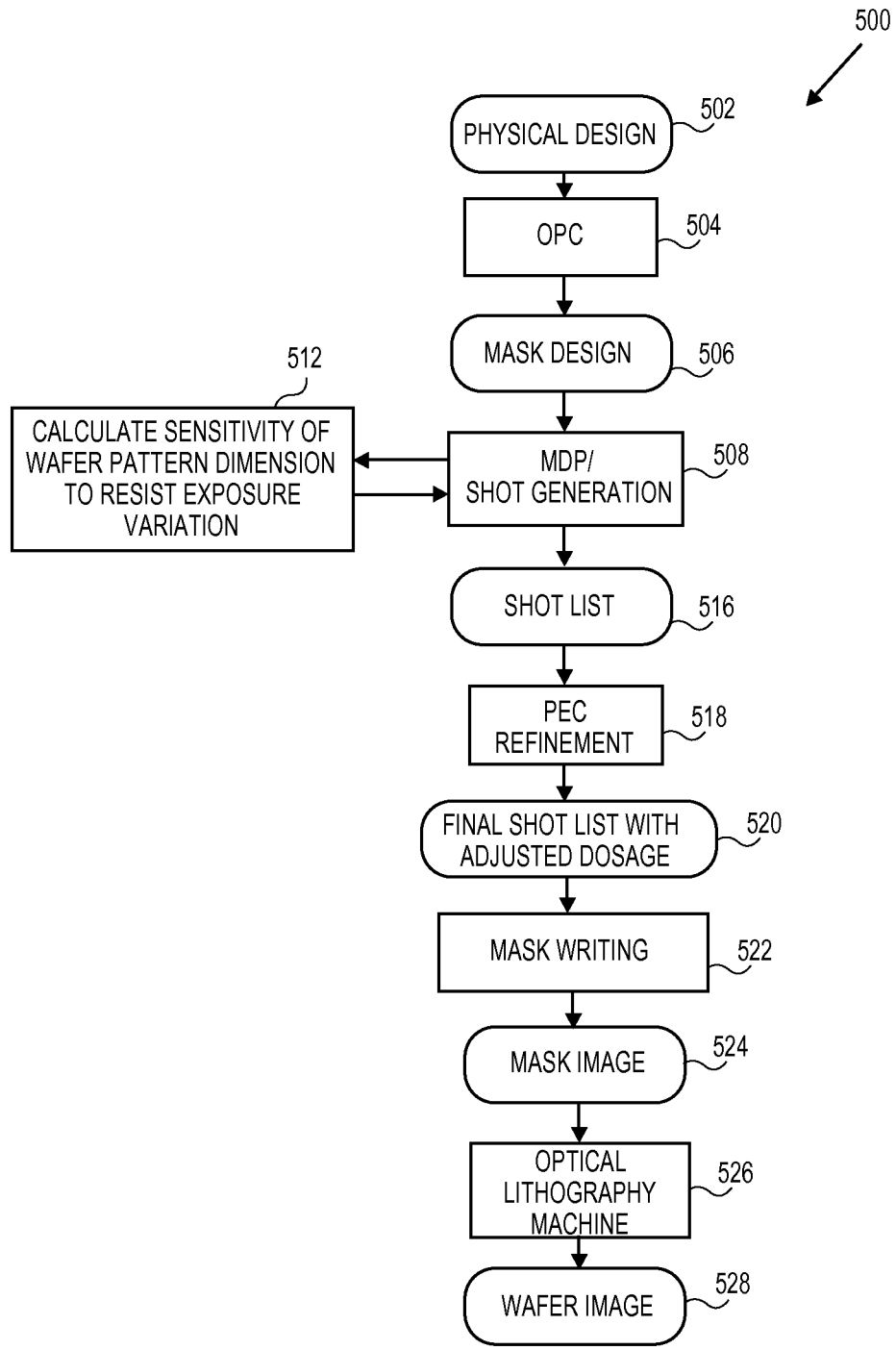
FIG. 5 illustrates a conceptual flow diagram of a method for mask data preparation in one embodiment.

FIG. 5 is a conceptual flow diagram 500 for forming patterns on substrates such as a silicon wafer using optical lithography, according to another embodiment of the current disclosure. In a first step 502, a physical design, such as a physical design of an integrated circuit, is created. This can include determining the logic gates, transistors, metal layers, and other items that are required to be found in a physical design such as the physical design of an integrated circuit. Next, in a step 504, optical proximity correction (OPC) is done on the patterns in the physical design 502 or on a portion of the patterns in the physical design to create a mask design 506. OPC alters the physical design to compensate for distortions caused by effects such as optical diffraction and the optical interaction of features with proximate features. In some embodiments, OPC step 504 may comprise ILT. In step 508, the mask design 506 is fractured into a set of charged particle beam shots for a shaped beam charged particle beam system to create shot list 516. In some embodiments the shots will be VSB shots. In other embodiments the shots will be CP shots or a combination of VSB and CP shots. Shot list 516 may comprise shots for a single exposure pass, or for multiple exposure passes. MDP shot generation step 508 may comprise calculating the sensitivity of dimensions for wafer patterns with respect to variations in resist exposure, using the shots being generated, the sensitivity calculations being illustrated as step 512, where the wafer patterns are to be formed in step 526 below. In one embodiment the method illustrated in flow diagram 400 (FIG. 4) may be used for step 512. MDP step 508 may comprise using model-based fracturing techniques. MDP step 508 may comprise generating a shot configuration which produces higher dosage at the perimeter of one or more patterns than in the interior of the patterns. In some embodiments, shots will be generated so as to produce a wafer pattern sensitivity to resist exposure variation that is below a pre-determined limit.

The shot list 516 may be read by a proximity effect correction (PEC) refinement step 518, in which shot dosages are adjusted to account for backscatter, fogging, and loading effects, creating a final shot list with adjusted dosages 520. The final shot list with adjusted dosages 520 is used to generate a surface in a mask writing step 522, which uses a charged particle beam writer such as an electron beam writer system. Depending on the type of charged particle beam writer being used, PEC refinement 518 may be performed by the charged particle beam writer. Mask writing step 522 may comprise a single exposure pass or multiple exposure passes. The electron beam writer system projects a beam of electrons through a stencil onto a surface to form a mask image 524 comprising patterns on the surface. The completed surface, such as a reticle, may then be used in an optical lithography machine, which is shown in a step 526. Finally, in a step 528, an image on a substrate such as a silicon wafer is produced.

Figure 6:
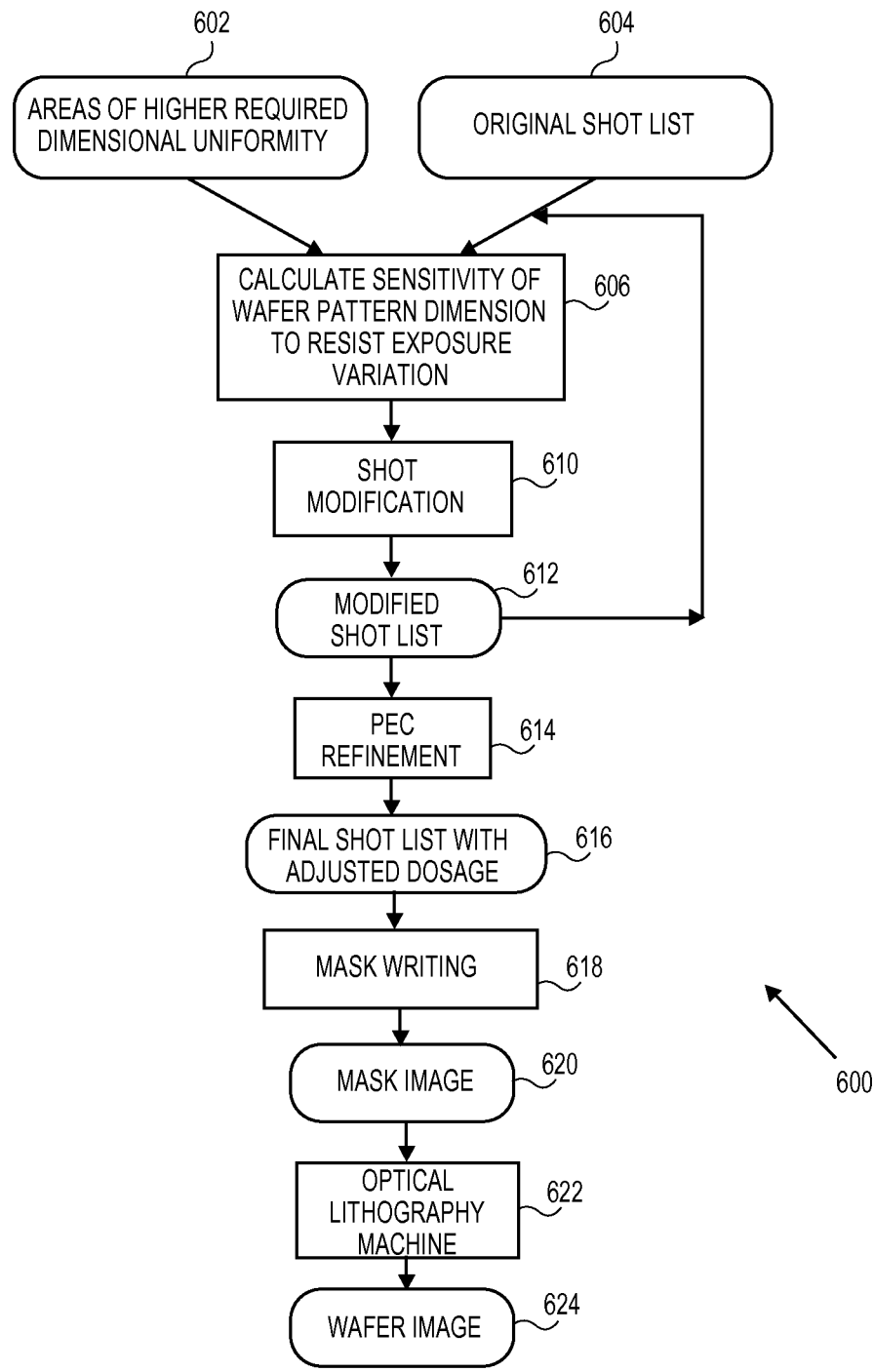
FIG. 6 illustrates a conceptual flow diagram of a method for mask process correction in one embodiment.

FIG. 6 is an exemplary conceptual flow diagram 600 for forming a pattern on a substrate such as a wafer, starting from a previously-generated shot list, and performing mask process correction. Flow 600 begins with original shot list 604, which may comprise shots for one exposure pass or for multiple exposures passes. In step 606 sensitivity of the wafer pattern dimensions to variation in the resist exposure used in mask writing is calculated. In one embodiment the method illustrated in conceptual flow diagram 400 (FIG. 4) may be used for step 606. In another embodiment, step 606 also uses as input information 602 about the areas in the design where a higher level of dimensional uniformity is required on the wafer. If step 606 determines that the mask pattern that would be generated by original shot list 604 would produce pattern areas of excessive sensitivity on the wafer, the shots are modified in step 610. In some embodiments the shot modification 610 may comprise increasing dosage of shots which form the mask patterns which form areas of high sensitivity in the wafer pattern. In other embodiments shot modification 610 may comprise increasing dosage only near the perimeter of the mask patterns which form areas of high sensitivity in the wafer pattern. Shot modification 610 may comprise generating shots which overlap within an exposure pass. Shot modification 610 creates a modified shot list 612. In some embodiments, the wafer sensitivity using modified shot list 612 may be re-calculated in a second pass of step 606. If re-calculation is performed and sensitive parts of the wafer pattern are still found, additional shot modification may be performed in a second pass of step 610, creating a further-modified shot list 612.

In a proximity effect correction (PEC) refinement step 614, shot dosages may be adjusted to account for backscatter, loading and fogging effects, creating a final shot list 616. The final shot list 616 is used to generate a surface in a mask writing step 618, which uses a charged particle beam writer such as an electron beam writer system. Depending on the type of charged particle beam writer being used, PEC refinement 614 may be performed by the charged particle beam writer. Mask writing step 618 may comprise a single exposure pass or multiple exposure passes. The electron beam writer system projects a beam of electrons through a stencil onto a surface to form a mask image 620 comprising patterns on the surface. After further processing steps, the completed surface may then be used in an optical lithography machine, which is shown in a step 622, to produce an image on a substrate such as a silicon wafer 624.

There are other factors besides resist exposure variation that may undesirably affect CD of mask patterns and of the subsequently exposed wafer patterns. For example, variation in shot placement and variation in VSB shot size are other factors that can negatively affect CD. Monte Carlo simulations can be done in which random positional, size and dosage errors are introduced to individual shots, so as to determine the effects of the combined variations. These simulations indicate that the embodiments set forth herein to generate and modify shot lists to produce wafer patterns which have a dimensional sensitivity below a pre-determined limit do, in fact, produce similar dimensional sensitivities even when variations of shot position and shot size are included in the simulations.

The calculations described or referred to in this disclosure may be accomplished in various ways. Generally, calculations may be accomplished by in-process, pre-process or post-process methods. In-process calculation involves performing a calculation at the time when its results are needed. Pre-process calculation involves pre-calculating and then storing results for later retrieval during a subsequent processing step, and may improve processing performance, particularly for calculations that may be repeated many times. Calculations may also be deferred from a processing step and then done in a later post-proces sing step. An example of pre-process calculation is pre-calculating a shot configuration that will produce a minimum mask or wafer CD variation for a given situation, and storing information about this shot configuration in a table. Another example of pre-process calculation is a shot group, which is a pre-calculation of dosage pattern information for one or more shots associated with a given input pattern or set of input pattern characteristics. The shot group and the associated input pattern may be saved in a library of pre-calculated shot groups, so that the set of shots comprising the shot group can be quickly generated for additional instances of the input pattern, without pattern re-calculation. In some embodiments, the pre-calculation may comprise simulation of the dosage pattern that the shot group will produce on a reticle. In other embodiments, the shot group may be determined without simulation, such as by using correct-by-construction techniques. In other embodiments the pre-calculation may comprise calculation of wafer or mask dimensions to variation in resist exposure. In some embodiments, the pre-calculated shot groups may be stored in the shot group library in the form of a list of shots. In other embodiments, the pre-calculated shot groups may be stored in the form of computer code that can generate shots for a specific type or types of input patterns. In yet other embodiments, a plurality of pre-calculated shot groups may be stored in the form of a table, where entries in the table correspond to various input patterns or input pattern characteristics such as pattern width, and where each table entry provides either a list of shots in the shot group, or information for how to generate the appropriate set of shots. Additionally, different shot groups may be stored in different forms in the shot group library. In some embodiments, the dosage pattern which a given shot group can produce may also be stored in the shot group library. In one embodiment, the dosage pattern may be stored as a two-dimensional (X and Y) dosage map called a glyph.

The fracturing, mask data preparation, shot list modification and pattern formation flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or some other parameter. In yet another embodiment, an initial set of shots may be determined in a correct-by-construction method, so that no shot modifications are required.

Figure 8:
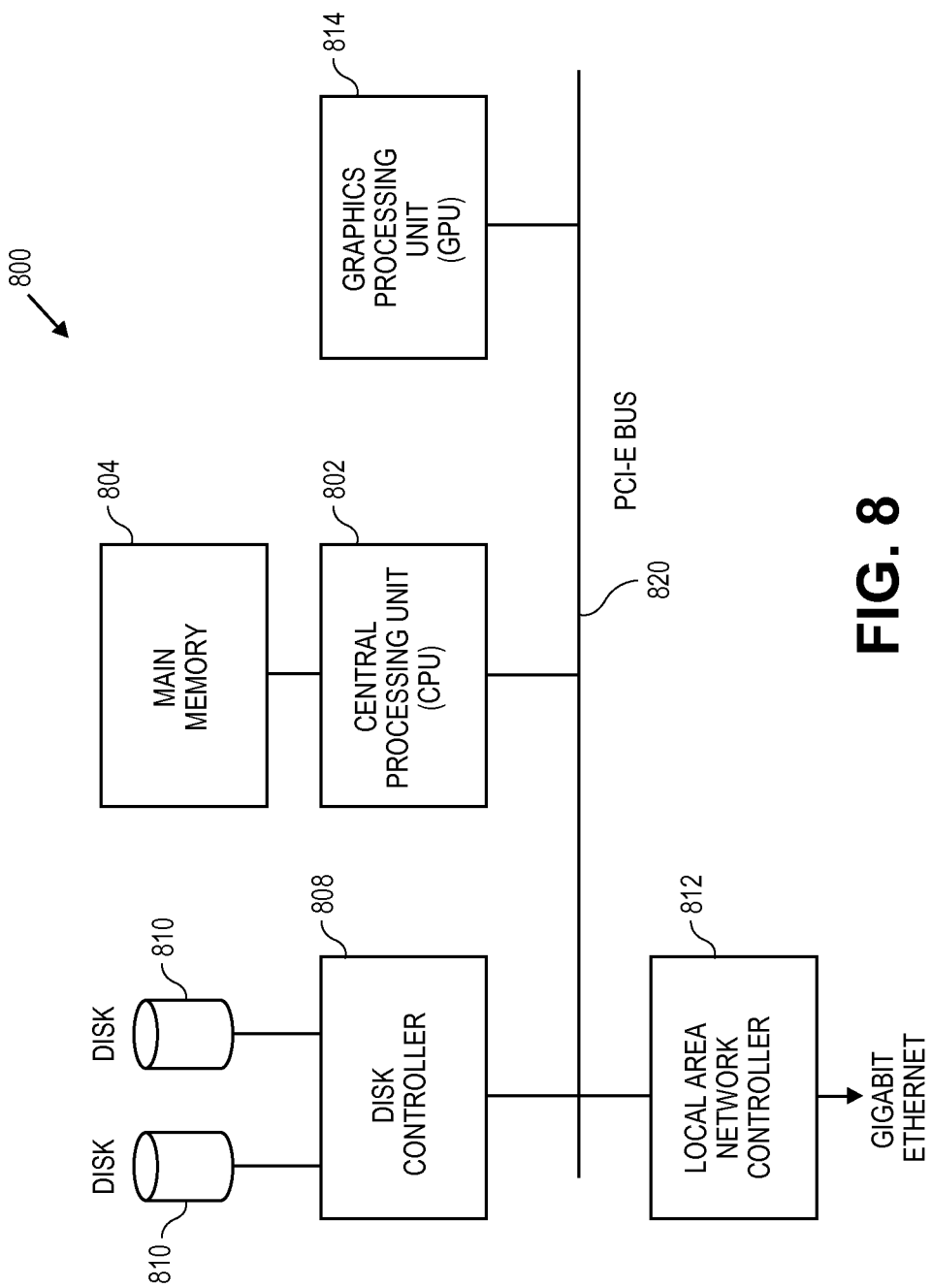
FIG. 8 illustrates an exemplary computing hardware device used in embodiments of the methods.

FIG. 8 illustrates an example of a computing hardware device 800 that may be used to perform the calculations described in this disclosure. Computing hardware device 800 comprises a central processing unit (CPU) 802, with attached main memory 804. The CPU may comprise, for example, eight processing cores, thereby enhancing performance of any parts of the computer software that are multi-threaded. The size of main memory 804 may be, for example, 64 G-bytes. The CPU 802 is connected to a Peripheral Component Interconnect Express (PCIe) bus 820. A graphics processing unit (GPU) 814 is also connected to the PCIe bus. In computing hardware device 800 the GPU 814 may not, despite its name, be connected to a graphics output device. Rather, GPU 814 may be used purely as a high-speed parallel computation engine. The computing software may, with the use of appropriate GPU interface software, obtain significantly-higher performance by using the GPU for a portion of the calculations, compared to using CPU 802 for all the calculations. The CPU 802 communicates with the GPU 814 via PCIe bus 820. In other embodiments (not illustrated) GPU 814 may be integrated with CPU 802, rather than being connected to the PCIe bus. Disk controller 808 is also attached to the PCIe bus, with, for example, two disks 810 connected to disk controller 808. Finally, a local area network (LAN) controller 812 is attached to the PCIe bus, and provides Gigabit Ethernet (GbE) connectivity to other computers. In some embodiments, the computer software and/or the design data are stored on disks 810. In other embodiments, either the computer programs or the design data or both the computer programs and the design data may be accessed from other computers or file serving hardware using the GbE Ethernet.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, mask data preparation, shot list modification and optical proximity correction may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for fracturing or mask data preparation comprising:
    determining pattern exposure information that is capable of forming a reticle pattern on a resist-coated reticle with a charged particle beam writer, wherein the reticle is to be used to form a wafer pattern on a substrate using optical lithography, and
    wherein the determining comprises calculating a sensitivity of the wafer pattern to changes in resist exposure of the reticle, and wherein the determining is performed using a computing hardware device.

2. The method of claim 1 wherein the change in resist exposure comprises a change in threshold of the resist.

3. The method of claim 1 wherein the change in resist exposure comprises a change in charged particle dosage delivered to the resist.

4. The method of claim 1 wherein the charged particle beam writer is a shaped beam charged particle beam writer, and wherein the pattern exposure information comprises a plurality of shots for the shaped beam charged particle beam writer.

5. The method of claim 4 wherein the shot dosage of each shot in the plurality of shots is unspecified before proximity effect correction (PEC) is done.

6. The method of claim 1 wherein the charged particle beam writer is a multi-beam charged particle beam system, and wherein the pattern exposure information comprises exposure instructions for the multi-beam charged particle beam exposure system.

7. The method of claim 1 wherein calculating the sensitivity of the wafer pattern comprises calculating a change in dimension of a feature on the reticle pattern for a given change in the resist exposure.

8. The method of claim 7 wherein calculating the change in dimension of a feature on the reticle pattern for a given change in the resist exposure comprises charged particle beam simulation.

9. The method of claim 8 wherein the charged particle beam simulation includes at least one of a group consisting of forward scattering, backward scattering, resist diffusion, Coulomb effect, etching, fogging, loading and resist charging.

10. The method of claim 1 wherein calculating the sensitivity of the wafer pattern comprises calculating a change in dimension of a feature on the wafer pattern for a given change in dimension of a feature on the reticle pattern.

11. The method of claim 10 wherein calculating the sensitivity of the wafer pattern to a given change in dimension of a feature on the reticle pattern comprises lithography simulation.

12. The method of claim 1 wherein the pattern exposure information is determined so that the calculated sensitivity is optimized.

13. The method of claim 12 wherein the determining comprises providing a higher-than-normal dosage to the reticle near the perimeter of the reticle pattern so that the calculated sensitivity is below a pre-determined limit.

14. The method of claim 13 wherein the pre-determined limit is in the range of 1.49% of normal dosage per nm to 1.75% of normal dosage per nm.

15. The method of claim 13 wherein the pattern exposure information comprises a plurality of shots for a shaped beam charged particle beam writer, and wherein the higher-than-normal reticle dosage is provided using overlapping shots.

16. A method for mask process correction (MPC) or forming a reticle pattern on a resist-coated reticle, the method comprising:
    inputting pattern exposure information for a charged particle beam writer, wherein the pattern exposure information is capable of forming the reticle pattern on the reticle to be used to form a wafer pattern on a substrate using optical lithography;
    inputting resist exposure information for the reticle;
    calculating a sensitivity of the wafer pattern to changes in the resist exposure of the reticle, wherein the calculating is performed using a computing hardware device; and
    modifying the pattern exposure information to reduce the calculated sensitivity.

17. The method of claim 16 wherein the change in resist exposure comprises a change in threshold of the resist.

18. The method of claim 16 wherein the change in resist exposure comprises a change in charged particle dosage delivered to the resist.

19. The method of claim 16 wherein the charged particle beam writer is a shaped beam charged particle beam writer, and wherein the charged particle beam exposure information comprises a plurality of shots for the shaped beam charged particle beam writer.

20. The method of claim 19 wherein the modifying comprises generating a shot which overlaps another shot in the set of shots.

21. The method of claim 16 wherein the charged particle beam writer is a multi-beam charged particle beam system, and wherein the charged particle beam exposure information comprises exposure instructions for the multi-beam charged particle beam exposure system.

22. The method of claim 16, further comprising forming the reticle pattern on the reticle with the modified pattern exposure information and the charged particle beam writer.

23. The method of claim 16 wherein the modifying comprises increasing dosage delivered to the reticle near the perimeter of the reticle pattern.

24. The method of claim 16, further comprising inputting information about which areas of the wafer pattern have a high dimensional uniformity requirement, wherein the modifying comprises reducing the calculated sensitivity to a lower value in the areas of the wafer pattern which have the high dimensional uniformity requirement, compared to other areas of the wafer pattern.

25. A system for mask process correction, the system comprising:
- a device configured to input pattern exposure information for a charged particle beam writer, wherein the pattern exposure information is capable of forming a reticle pattern on a reticle to be used to form a wafer pattern on a substrate using optical lithography;
- a device configured to input resist exposure information;
- a device configured to calculate a sensitivity of the wafer pattern to changes in the resist exposure of the reticle; and
- a device configured to modify the pattern exposure information to reduce the calculated sensitivity.

26. The system of claim 25 wherein the device configured to modify increases dosage delivered to the reticle near the perimeter of the reticle pattern.

* * * * *